(12) United States Patent
Miyake

(10) Patent No.: US 8,878,419 B2
(45) Date of Patent: Nov. 4, 2014

(54) PIEZOELECTRIC DEVICE

(75) Inventor: Takashi Miyake, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 241 days.

(21) Appl. No.: 13/348,033

(22) Filed: Jan. 11, 2012

(65) Prior Publication Data

US 2012/0194034 A1    Aug. 2, 2012

(30) Foreign Application Priority Data

Jan. 27, 2011   (JP) ................. 2011-015825

(51) Int. Cl.
*H03H 9/56* (2006.01)
*H03H 9/13* (2006.01)
*H03H 3/04* (2006.01)

(52) U.S. Cl.
CPC ....... *H03H 9/564* (2013.01); *H03H 2003/0471* (2013.01); *H03H 9/566* (2013.01); *H03H 9/132* (2013.01)
USPC .......................................... 310/320; 310/312

(58) Field of Classification Search
USPC ......................................... 310/312, 320, 326
See application file for complete search history.

(56) References Cited

U.S. PATENT DOCUMENTS

| | | | |
|---|---|---|---|
| 2006/0103492 A1* | 5/2006 | Feng et al. | 333/187 |
| 2006/0255883 A1* | 11/2006 | Ebuchi | 333/191 |
| 2006/0290446 A1 | 12/2006 | Aigner et al. | |
| 2009/0001848 A1* | 1/2009 | Umeda et al. | 310/312 |

FOREIGN PATENT DOCUMENTS

JP        2007-6495 A     1/2007

* cited by examiner

*Primary Examiner* — Derek Rosenau
(74) *Attorney, Agent, or Firm* — Keating & Bennett, LLP

(57) ABSTRACT

A piezoelectric device includes first and second piezoelectric resonators each including a piezoelectric thin film, an upper electrode provided on one main surface of the piezoelectric thin film, and a lower electrode provided on another main surface of the piezoelectric thin film. In the piezoelectric resonators, portions in which the upper and lower electrodes are superposed on each other with the piezoelectric thin film therebetween define piezoelectric vibrating portions that are acoustically isolated from a substrate. The first and second piezoelectric resonators are connected in series or parallel between an input terminal and an output terminal such that polarization directions of corresponding portions of the piezoelectric thin film are opposite to each other when seen from the input terminal. The first piezoelectric resonator and the second piezoelectric resonator are arranged to have different resonant frequencies of a transverse vibration mode.

12 Claims, 9 Drawing Sheets

PIEZOELECTRIC DEVICE

BACKGROUND OF THE INVENTION

1. Field of the Invention

The present invention relates to piezoelectric devices, and in particular relates to piezoelectric devices that include a piezoelectric resonator such as a BAW resonator.

2. Description of the Related Art

In the related art, piezoelectric resonators are known to include a piezoelectric vibrating portion that is acoustically isolated from a substrate, such as a BAW resonator.

There is a problem with this type of piezoelectric device that includes a piezoelectric resonator in that, due to the polarization of a piezoelectric thin film, the piezoelectric resonator is not displaced linearly with voltage, but rather is displaced non-linearly. A known example of a piezoelectric device that solves this problem is described in Japanese Unexamined Patent Application Publication No. 2007-6495. In the piezoelectric device described in Japanese Unexamined Patent Application Publication No. 2007-6495, as illustrated in FIG. 9, a first BAW resonator 172 and a second BAW resonator 174 are connected in parallel with each other between a first electrical terminal 176 and a second electrical terminal 178. Arrow 172R, which indicates the polarization direction of the first BAW resonator 172, and arrow 174R, which indicates the polarization direction of the second BAW resonator 174, point in opposite directions to each other when viewed from the first electrical terminal 176. Accordingly, in this piezoelectric device, it is possible to cancel out the non-linear effect that occurs due to the polarization direction dependence.

In general, resonance characteristics of a thickness extensional vibration mode are employed in a BAW resonator, but sometimes ripples are generated in a band due to a transverse vibration mode, which is not desirable in normal operation. However, it is desirable that piezoelectric resonators having the same impedance be connected in parallel with each other in order to suppress the non-linear effect. In such a case, the frequency of ripples and the strength of ripples, which ripples are generated by the individual piezoelectric resonators, are the same. Therefore, there has been a problem in that the ripples reinforce each other and the characteristics of the piezoelectric resonators are degraded.

SUMMARY OF THE INVENTION

In view of these problems, preferred embodiments of the present invention provide a piezoelectric device that prevents the generation of unwanted ripples.

A piezoelectric device according to a preferred embodiment of the present invention includes first and second piezoelectric resonators that each include a piezoelectric thin film, an upper electrode provided on one main surface of the piezoelectric thin film and a lower electrode provided on another main surface of the piezoelectric thin film. The first piezoelectric resonator and the second piezoelectric resonator are connected to each other in series or in parallel between an input terminal and an output terminal such that polarization directions of corresponding portions of the piezoelectric thin film are opposite to each other when viewed from the input terminal. The first piezoelectric resonator and the second piezoelectric resonator are arranged to have different resonant frequencies of a transverse vibration mode response.

With the present preferred embodiment of the present invention, by forming a first piezoelectric resonator and a second piezoelectric resonator so as to have different resonant frequencies of a transverse vibration mode response, a piezoelectric device is obtained in which ripples formed due to a transverse vibration mode do not reinforce each other and that has excellent resonance characteristics and filter characteristics.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereafter, preferred embodiments for carrying out the present invention will be described.

First Preferred Embodiment

Figure 1:
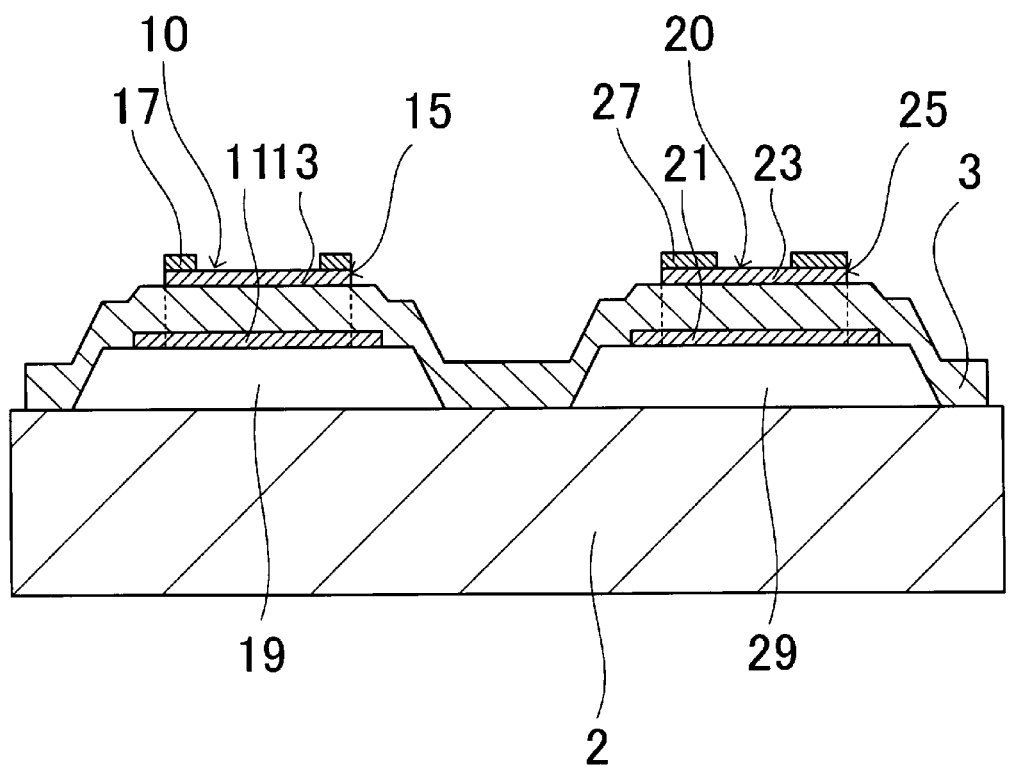
FIG. 1 is a schematic sectional view illustrating a piezoelectric device according to a first preferred embodiment of the present invention.

FIG. 1 is a schematic sectional view illustrating a piezoelectric device according to a preferred embodiment of the present invention. A piezoelectric device 1 includes a first piezoelectric resonator 10, a second piezoelectric resonator 20 and a substrate 2.

The substrate 2 is arranged to support the first piezoelectric resonator 10 and the second piezoelectric resonator 20. Examples of a material of the substrate 2 include silicon-based materials and insulating materials such as insulating ceramics and insulating resins.

The first piezoelectric resonator 10 and the second piezoelectric resonator 20 are provided on one main surface of the substrate 2. The first piezoelectric resonator 10 includes a piezoelectric thin film 3, an upper electrode 13, which is provided on one main surface of the piezoelectric thin film 3, and a lower electrode 11, which is provided on another main surface of the piezoelectric thin film 3. In this preferred embodiment, the lower electrode 11 preferably has a larger area than the upper electrode 13. Similarly, the second piezoelectric resonator 20 includes the piezoelectric thin film 3, an upper electrode 23, which is provided on the one main surface of the piezoelectric thin film 3, and a lower electrode 21, which is provided on the other main surface of the piezoelectric thin film 3.

A piezoelectric vibrating portion 15 is defined by a portion in which the upper electrode 13 and the lower electrode 11 are superposed on each other with the piezoelectric thin film 3 therebetween. Examples of a material of the piezoelectric thin film 3 include AlN and the polarization direction thereof is the thickness direction of the piezoelectric thin film 3. When an alternating voltage is applied across the upper electrode 13 and the lower electrode 11, resonance characteristics using a thickness extensional vibration mode are obtained. In this case, the piezoelectric vibrating portion 15 is an energy-confining-type piezoelectric vibrating portion. The thickness of the piezoelectric thin film 3 is, for example, about 0.1 μm to about 10 μm. Similarly, a piezoelectric vibrating portion 25 is defined by a portion in which the upper electrode 23 and the lower electrode 21 are superposed on each other with the piezoelectric thin film 3 disposed therebetween.

The materials of the upper electrodes 13 and 23 and the lower electrodes 11 and 21 are conductive materials and may be, for example, noble metals such as W or base metals such as Al.

The piezoelectric vibrating portions 15 and 25 are arranged so as to be acoustically isolated from the substrate 2. In this preferred embodiment, the piezoelectric vibrating portions 15 and 25 are arranged so as to float above the substrate 2 with cavities 19 and 29 therebetween. The piezoelectric thin film 3 is fixed to the one main surface of the substrate 2 around the peripheries of the cavities 19 and 29. The piezoelectric vibrating portions 15 and 25 may be acoustically isolated from the substrate 2 by using acoustic reflection layers instead of the cavities 19 and 29.

The cavities 19 and 29, for example, are formed preferably by forming a sacrificial layer out of ZnO and then removing the sacrificial layer through wet etching. In addition, the piezoelectric thin film 3, the upper electrodes 13 and 23, and the lower electrodes 11 and 21 are, for example, formed by first forming a thin film by sputtering and then performing patterning by photolithography.

Figure 2A:
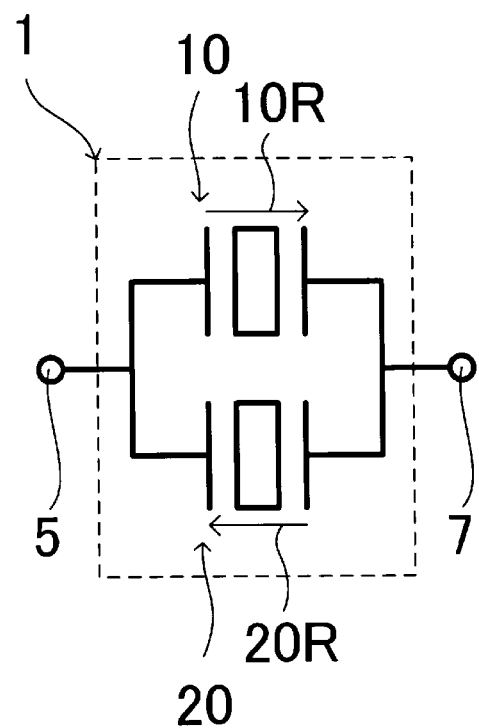
FIGS. 2A and 2B are schematic diagrams of circuits in which the piezoelectric device according to the first preferred embodiment of the present invention is connected to an input terminal and an output terminal.
Figure 2B:
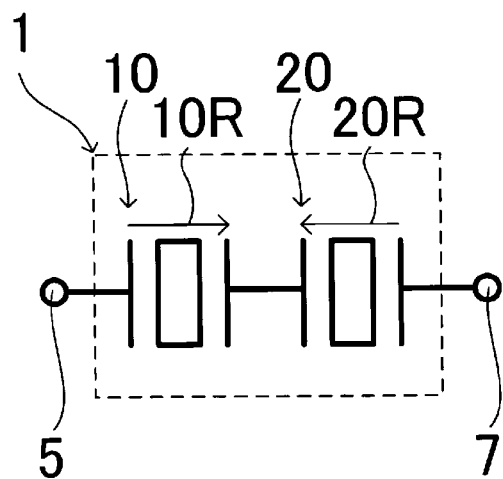

FIGS. 2A and 2B are schematic diagrams of circuits in which the piezoelectric device according to a preferred embodiment of the present invention is connected to an input terminal and an output terminal. FIG. 2A illustrates an example of a parallel connection and FIG. 2B illustrates an example of a serial connection.

In FIG. 2A, the first piezoelectric resonator 10 and the second piezoelectric resonator 20 are connected in parallel to each other between an input terminal 5 and an output terminal 7. Arrow 10R indicates the polarization direction of the piezoelectric thin film in the first piezoelectric resonator 10. In addition, arrow 20R indicates the polarization direction of the piezoelectric thin film in the second piezoelectric resonator 20. The polarization direction 10R of the first piezoelectric resonator 10 and the polarization direction 20R of the second piezoelectric resonator 20 are opposite to each other when viewed from the input terminal 5.

Similarly, FIG. 2B illustrates an example of serial connection in which the first piezoelectric resonator 10 and the second piezoelectric resonator 20 are connected in series to each other between the input terminal 5 and the output terminal 7. The polarization direction 10R of the first piezoelectric resonator 10 and the polarization direction 20R of the second piezoelectric resonator 20 are opposite to each other when viewed from the input terminal 5.

Comparing the examples of the serial connection and the parallel connection, in a case in which two piezoelectric resonators having the same impedance are connected to each other, the impedance when the parallel connection is used is four times the impedance when the serial connection is used. Therefore, since the area when the parallel connection is used may be about a quarter that when the serial connection is used to obtain an identical impedance, there is an advantage that size reduction is possible when parallel connection is used.

In a preferred embodiment of the present invention, the first piezoelectric resonator 10 and the second piezoelectric resonator 20 are arranged to have different resonant frequencies of a transverse vibration mode response. In the first piezoelectric resonator 10 and the second piezoelectric resonator 20, there is a problem in that as well as resonance caused by a thickness extensional vibration mode, ripples, which propagate in a direction within the plane of piezoelectric thin film 3 and are caused by a transverse vibration mode, occur and these ripples reinforce each other. Accordingly, in a preferred embodiment of the present invention, by arranging the resonators so as to have different resonant frequencies from each other of a transverse vibration mode response, a piezoelectric device is obtained in which such ripples do not reinforce each other and that has excellent resonance characteristics and filter characteristics.

It is preferable that the first piezoelectric resonator 10 and the second piezoelectric resonator 20 have the same resonant frequency in the thickness extensional vibration mode. In this case, since the impedances are also the same and it is likely that ripples will reinforce each other, the effects and advantages of the present preferred embodiment of the present invention are pronounced.

As illustrated in FIG. 1, an acoustic-velocity-changing film 17 is arranged along at least a portion of a peripheral portion of a main surface of the piezoelectric vibrating portion 15. In addition, an acoustic-velocity-changing film 27 is arranged along at least a portion of a peripheral portion of a main surface of the piezoelectric vibrating portion 25. In this preferred embodiment, the acoustic-velocity-changing films 17 and 27 are arranged in substantially band-like shapes and have different line widths from each other. Consequently, the first piezoelectric resonator 10 and the second piezoelectric resonator 20 have different resonant frequencies of the transverse vibration mode response and ripples of the transverse vibration mode response are prevented from reinforcing each other. Since the line width may be changed by simply changing the mask pattern when sputtering and photolithography are used, manufacturing can be simplified.

In this preferred embodiment, the acoustic-velocity-changing films 17 and 27 are preferably made of the same material. Examples of the material of the acoustic-velocity-changing films 17 and 27 include a conductive material that is the same as that of the upper electrodes 13 and 23 and the lower electrodes 11 and 21. In addition, an insulating material such as $SiO_2$ may preferably be used, for example, as the material of the acoustic-velocity-changing films.

In addition, in this preferred embodiment, the acoustic-velocity-changing film 17 is arranged so as to be in contact with the periphery of piezoelectric vibrating portion 15. In this case, transverse-vibration-mode ripples can be more effectively prevented and suppressed. The same is true for the acoustic-velocity-changing film 27.

In addition, in this preferred embodiment, the acoustic-velocity-changing film 17 is disposed on the upper electrode 13. In this case, there is an advantage in that it is easy to form the acoustic-velocity-changing film 17. The same is true for the acoustic-velocity-changing film 27.

Figure 3:
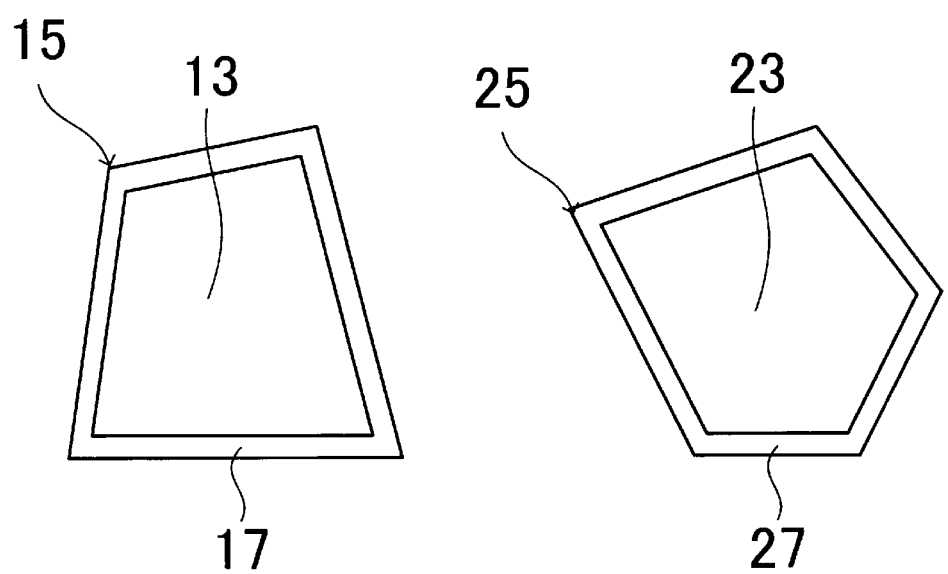
FIG. 3 is a schematic plan view of piezoelectric vibrators and acoustic-velocity-changing films used in the piezoelectric device according to the first preferred embodiment of the present invention.

FIG. 3 is a schematic plan view of the piezoelectric vibrating portions 15 and 25 and acoustic-velocity-changing films 17 and 27 used in the piezoelectric device according to a preferred embodiment of the present invention. The acoustic-velocity-changing film 17 disposed on the upper electrode 13 preferably has a substantially closed band-shape configuration extending along the periphery of the upper electrode 13. In this case, transverse-vibration-mode ripples can be more effectively prevented and suppressed. The same is true for the acoustic-velocity-changing film 27.

Furthermore, in FIG. 3, the acoustic-velocity-changing films 17 and 27 are arranged such that areas enclosed thereby have the same area but different shapes when viewed in plan. In this case, if the piezoelectric thin films of the respective piezoelectric vibrating portions are formed from the same material and so as to have the same thickness, they also have the same area and therefore the resonant frequencies in the thickness extensional vibration mode of the piezoelectric vibrators are the same and the effects and advantages of the present preferred embodiment of the present invention are pronounced.

In addition, in FIG. 3, the acoustic-velocity-changing films 17 and 27 are arranged such that areas enclosed thereby when viewed in plan have substantially polygonal shapes having no two sides that are parallel to each other. In this case, since there are no two sides that are parallel to each other, there is an advantage in that standing waves of the transverse vibration mode are not likely to be generated.

The piezoelectric device of the present preferred embodiment is equipped with two piezoelectric vibrators, but may be equipped with a different even number of piezoelectric resonators such as four or six, for example. In this case, provided that the number of piezoelectric vibrators having a positive polarization direction when seen from the input terminal and the number of piezoelectric vibrators having a negative polarization direction when seen from the input terminal are the same, the effects and advantages of preferred embodiments of the present invention is achieved.

In addition, in the present preferred embodiment, the piezoelectric thin film 3 is preferably arranged such that a portion thereof lies between the first piezoelectric resonator 10 and the second piezoelectric resonator 20, but may instead include two separate portions corresponding to the first piezoelectric resonator 10 and the second piezoelectric resonator 20.

Furthermore, in the present preferred embodiment, the acoustic-velocity-changing films 17 and 27 preferably have substantially closed band-shaped configurations, but may instead be arranged along at least a portion of each of the peripheries of the main surfaces of the piezoelectric vibrating portions 15 and 25. For example, a gap may be formed partially in each of the acoustic-velocity-changing films 17 and 27 having substantially closed band-shaped configurations, or the acoustic-velocity-changing films 17 and 27 may be arranged along just some of the sides of each of the upper electrodes 13 and 23.

In addition, in the present preferred embodiment, the acoustic-velocity-changing films 17 and 27 are preferably disposed on the upper electrodes 13 and 23, but instead may be disposed below the lower electrodes 11 and 21. In addition, the acoustic-velocity-changing films 17 and 27 may be disposed between the upper electrodes 13 and 23 and the piezoelectric thin film 3, or between the lower electrodes 11 and 21 and the piezoelectric thin film 3.

Furthermore, in the present preferred embodiment, the acoustic-velocity-changing films 17 and 27 are preferably arranged to be in contact with the peripheries of the piezoelectric vibrating portions 15 and 25, but instead may be formed so as to include the peripheries.

In addition, in the present preferred embodiment, the upper electrodes 13 and 23 and the lower electrodes 11 and 21 preferably have a monolayer structure, but for example may have a multilayer structure in which electrode layers and grounding layers, having a conductive component as a main component, are stacked on top of one another.

Second Preferred Embodiment

Figure 4:
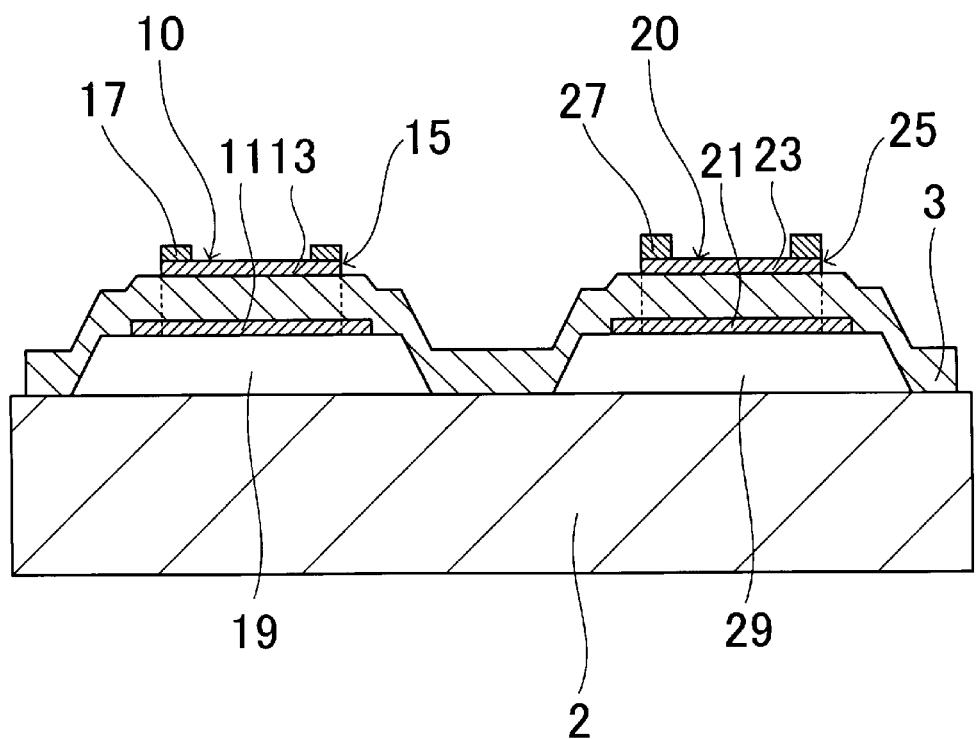
FIG. 4 is a schematic sectional view illustrating a piezoelectric device according to a second preferred embodiment of the present invention.

FIG. 4 is a schematic sectional view illustrating a piezoelectric device according to a second preferred embodiment of the present invention. Description of elements and components that are the same as in the first preferred embodiment will be omitted to avoid repetition. In the present preferred embodiment, the acoustic-velocity-changing films 17 and 27 preferably have different thicknesses from each other. Consequently, the resonant frequencies of the transverse vibration mode are different from each other and ripples of the transverse vibration mode are prevented from reinforcing each other.

Third Preferred Embodiment

Figure 5:
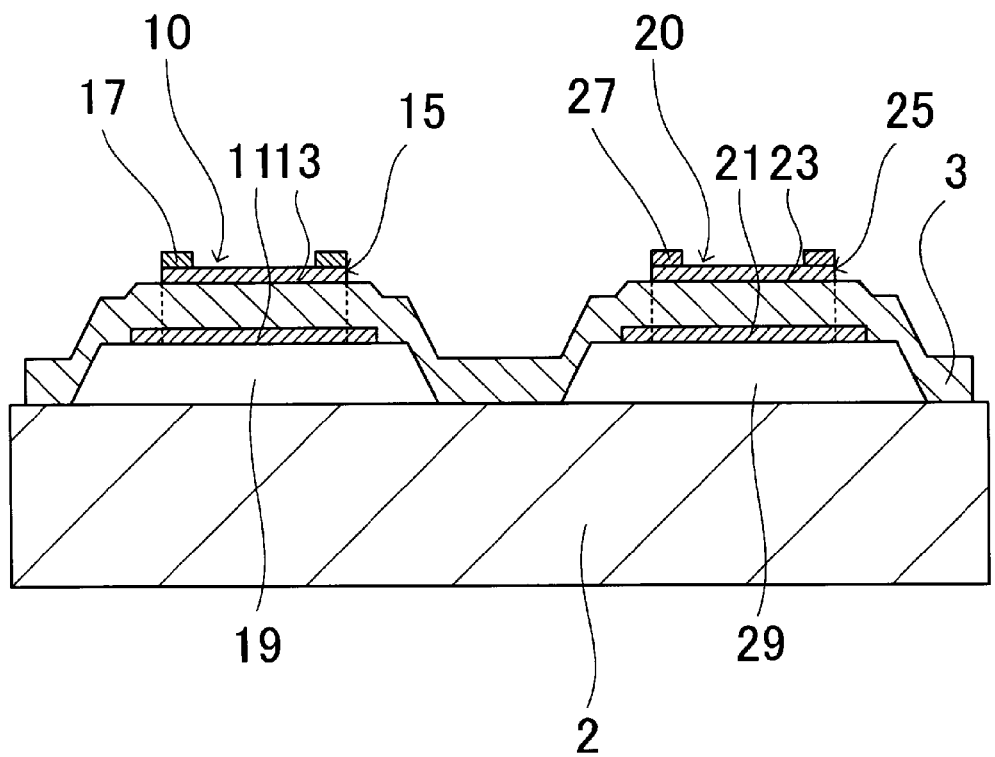
FIG. 5 is a schematic sectional view illustrating a piezoelectric device according to a third preferred embodiment of the present invention.

FIG. 5 is a schematic sectional view illustrating a piezoelectric device according to a third preferred embodiment of the present invention. In this preferred embodiment, the acoustic-velocity-changing films 17 and 27 are preferably made of different materials. For example, two different materials are selected from among various metal and insulator materials such as W, Mo, Ru, Ir, Al, Cu, Au, Pt, $SiO_2$, AlN, $Al_2O_3$ and $Si_3N_4$. Consequently, the resonant frequencies of the transverse vibration mode are different from each other and ripples of the transverse vibration mode are prevented from reinforcing each other.

Fourth Preferred Embodiment

Figure 6:
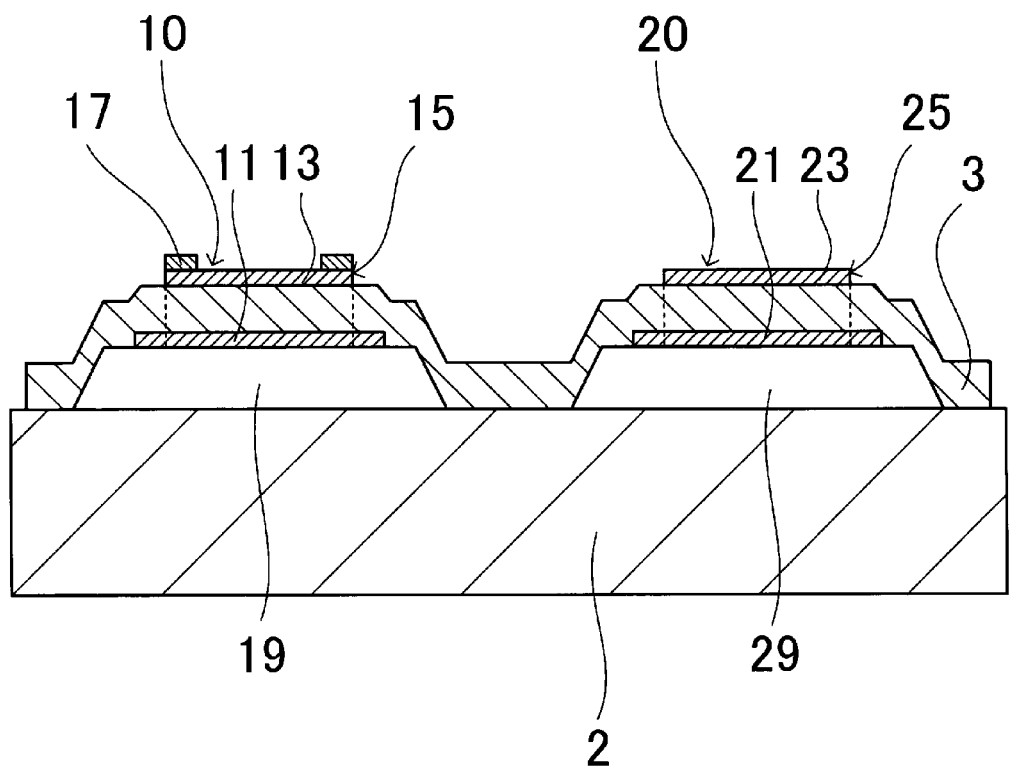
FIG. 6 is a schematic sectional view illustrating a piezoelectric device according to a fourth preferred embodiment of the present invention.

FIG. 6 is a schematic sectional view illustrating a piezoelectric device according to a preferred embodiment of the present invention. In the present preferred embodiment, among the first piezoelectric resonator 10 and the second piezoelectric resonator 20, the acoustic-velocity-changing film 17 is arranged along at least a portion of a peripheral portion of the main surface of the piezoelectric resonator 10. Also in this case, it is possible to make the resonant frequencies of the transverse vibration mode differ from each other.

The present invention is not limited to the above-described preferred embodiments and can be modified in various ways within a range that does not depart from the gist thereof.

Experimental Example

Figure 7:
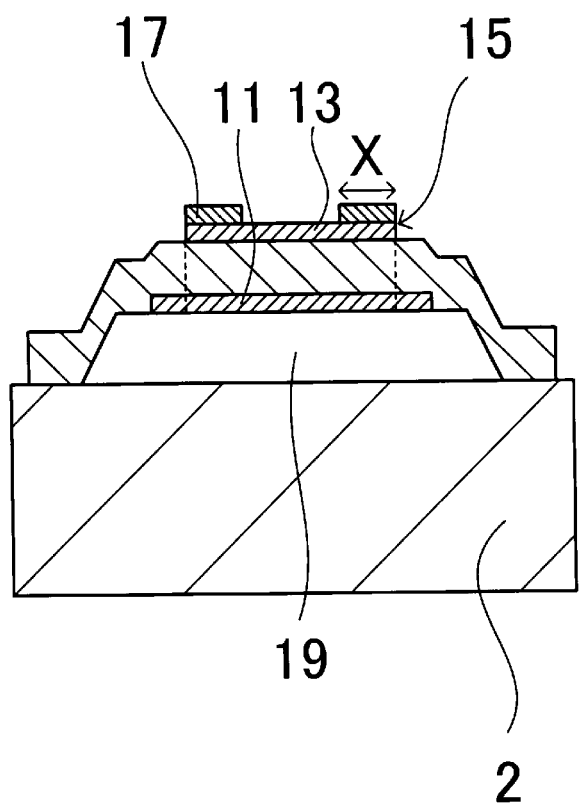
FIG. 7 is a schematic sectional view illustrating a piezoelectric resonator used in an experimental simulation.

The effects and advantages of various preferred embodiments of the present invention were confirmed by performing a simulation. FIG. 7 is a schematic sectional view illustrating a piezoelectric resonator 10 used in an experimental simulation. A piezoelectric resonator was adopted in which the upper electrode 13 and the lower electrode 11 have a substantially circular shape and the acoustic-velocity-changing film 17 is formed in a substantially closed band-shaped configuration extending along the periphery of the piezoelectric vibrating portion 15. Changes in the impedance and phase were checked while varying the line width of the acoustic-velocity-changing film 17 (X in FIG. 7) in the range of about 1 μm to about 3 μm, for example. The simulation was conducted under the following conditions.

| Acoustic-velocity-varying film | Material | Tungsten (W) |
|---|---|---|
| | Thickness | 100 nm |
| Upper electrodes | Material | Tungsten (W) |
| | Thickness | 600 nm |
| Piezoelectric layer | Material | Aluminum Nitride (AlN) |
| | Thickness | 1600 nm |
| Lower electrodes | Material | Tungsten (W) |
| Piezoelectric resonator | Thickness | 600 nm |
| | Area | 44000 μm$^2$ |

Figure 8A:
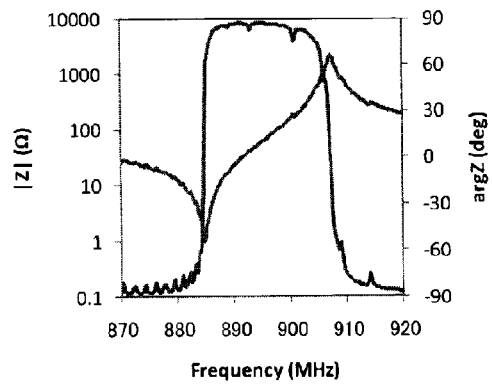
FIGS. 8A to 8C illustrate an impedance and a phase when the line width of an acoustic-velocity-changing film of the piezoelectric resonator of FIG. 7 is changed.
Figure 8B:
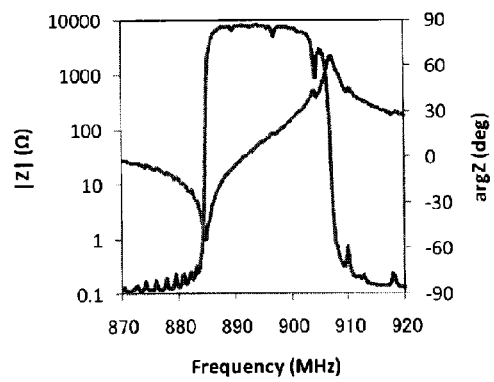
Figure 8C:
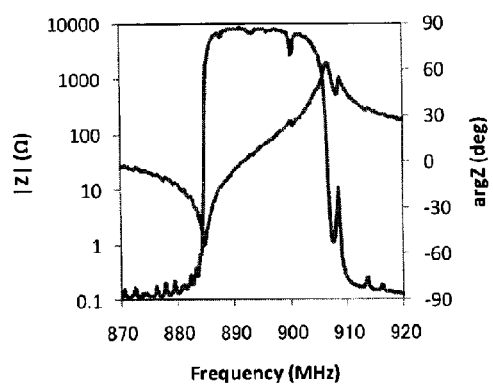
Figure 9:
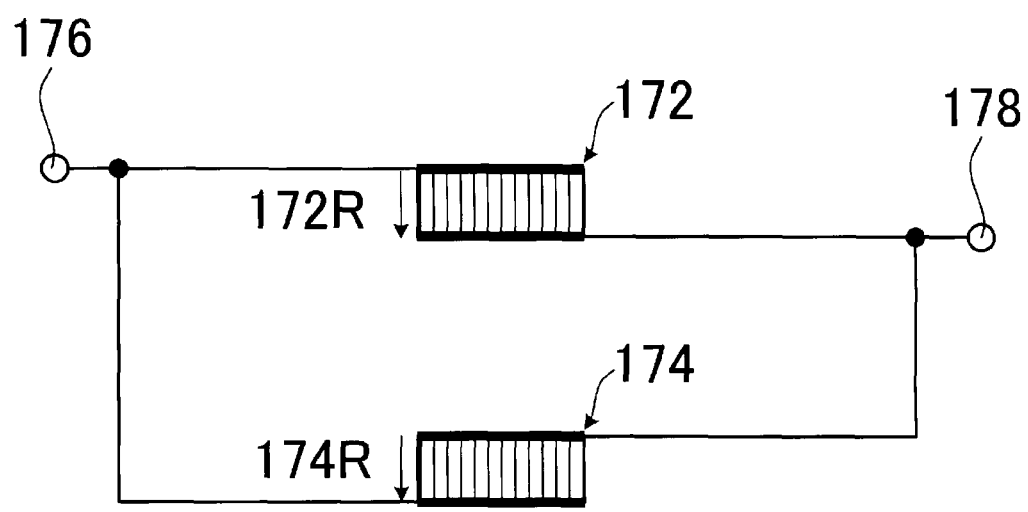
FIG. 9 is a schematic sectional view illustrating a piezoelectric device of the related art.

FIGS. 8A to 8C illustrate impedance and phase for cases in which the line width of an acoustic-velocity-changing film 17 of the piezoelectric resonator of FIG. 7 was changed. In FIG. 8A, the line width is about 1 μm, in FIG. 8B the line width is about 2 μm and in FIG. 8C the line width is about 3 μm, for example.

Comparing FIGS. 8A to 8C, when the line width of the acoustic-velocity-changing film is changed, the resonant frequency of the passband and the impedance outside the passband almost do not change at all. However, the frequency of ripples and strength of ripples within the passband of the piezoelectric resonator change in accordance with the line width of the acoustic-velocity-changing film. Therefore, by using in combination piezoelectric resonators that have acoustic-velocity-changing films of different line widths, it is possible to ensure that ripples are not superposed on with each other.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric device comprising:
   first and second piezoelectric resonators that each include a piezoelectric thin film and an upper electrode provided on one main surface of the piezoelectric thin film and a lower electrode provided on another main surface of the piezoelectric thin film, and that are connected to each other in series or in parallel between an input terminal and an output terminal such that polarization directions of corresponding portions of the piezoelectric thin film are opposite to each other when seen from the input terminal; wherein
   the first piezoelectric resonator and the second piezoelectric resonator have different resonant frequencies of a transverse vibration mode response.

2. The piezoelectric device according to claim 1, wherein the first piezoelectric resonator and the second piezoelectric resonator have the same resonant frequency of a thickness extensional vibration mode.

3. The piezoelectric device according to claim 1, wherein, in the first piezoelectric resonator and the second piezoelectric resonator, portions where the upper electrodes and the lower electrodes are superposed on each other with the piezoelectric thin film disposed therebetween define piezoelectric vibrating portions that are acoustically isolated from a substrate; and
   an acoustic-velocity-changing film is arranged along at least a portion of a peripheral portion of a main surface of at least one of the piezoelectric vibrating portions of the first piezoelectric resonator and the second piezoelectric resonator.

4. The piezoelectric device according to claim 1, wherein, in the first piezoelectric resonator and the second piezoelectric resonator, portions where the upper electrodes and the lower electrodes are superposed on each other with the piezoelectric thin film disposed therebetween define piezoelectric vibrating portions that are acoustically isolated from a substrate; and
   an acoustic-velocity-changing film is arranged along at least a portion of a peripheral portion of a main surface of each of the piezoelectric vibrating portions of the first piezoelectric resonator and the second piezoelectric resonator.

5. The piezoelectric device according to claim 3, wherein the acoustic-velocity-changing film has a substantially closed band-shaped configuration.

6. The piezoelectric device according to claim 3, wherein the acoustic-velocity-changing film is arranged so as to be in contact with at least a portion of a periphery of the piezoelectric vibrating portion.

7. The piezoelectric device according to claim 3, wherein the acoustic-velocity-changing film is located on the upper electrode.

8. The piezoelectric device according to claim 4, wherein the acoustic-velocity-changing films located on the respective piezoelectric vibrating portions of the first piezoelectric resonator and the second piezoelectric resonator have different line widths.

9. The piezoelectric device according to claim 4, wherein the acoustic-velocity-changing films located on the respective piezoelectric vibrating portions of the first piezoelectric resonator and the second piezoelectric resonator have different thicknesses.

10. The piezoelectric device according to claim 4, wherein the acoustic-velocity-changing films located on the respective piezoelectric vibrating portions of the first piezoelectric resonator and the second piezoelectric resonator are made of different materials.

11. The piezoelectric device according to claim 4, wherein the acoustic-velocity-changing films located on the respective piezoelectric vibrating portions of the first piezoelectric resonator and the second piezoelectric resonator are arranged such that areas enclosed thereby have the same area but have different shapes when viewed in plan.

12. The piezoelectric devices according to claim 4, wherein the acoustic-velocity-changing films located on the respective piezoelectric vibrating portions of the first piezoelectric resonator and the second piezoelectric resonator are arranged such that areas enclosed thereby are substantially polygonal shapes having no two sides that are parallel to each other when viewed in plan.

* * * * *